United States Patent
Tomaru et al.

(10) Patent No.: US 6,654,532 B1
(45) Date of Patent: Nov. 25, 2003

(54) READ-ONLY LAMINATED INFORMATION RECORDING MEDIUM AND MANUFACTURING METHOD THEREFOR

(75) Inventors: Satoru Tomaru, Mito (JP); Makoto Hikita, Mito (JP); Tadayuki Imai, Mito (JP); Tetsuyoshi Ishii, Isehara (JP); Haruki Kozawaguchi, Tokyo (JP); Saburo Imamura, Mito (JP); Shogo Yagi, Mito (JP)

(73) Assignee: Nippon Telegraph and Telephone Corporation (JP)

( * ) Notice: Subject to any disclaimer, the term of this patent is extended or adjusted under 35 U.S.C. 154(b) by 0 days.

(21) Appl. No.: 09/347,275

(22) Filed: Jul. 6, 1999

(65) Prior Publication Data (65)

(30) Foreign Application Priority Data

Jul. 7, 1998 (JP) ............................................. 10-191265

(51) Int. Cl.[7] .............................. G02B 6/10; G03H 1/02
(52) U.S. Cl. ............................................ 385/129; 359/34
(58) Field of Search ................................. 385/129–131, 385/37; 359/34, 3; 365/106–107, 125–127, 215, 216

(56) References Cited

U.S. PATENT DOCUMENTS

| 5,285,274 A | * | 2/1994 | Tanno et al. ................ 385/129 |
| 5,559,784 A | * | 9/1996 | Ota ............................ 369/107 |
| 6,556,531 B1 | * | 4/2003 | Yagi et al. .................. 369/103 |

FOREIGN PATENT DOCUMENTS

| JP | Hei 2-210626 | 8/1990 |
| JP | Hei 5-107419 | 4/1993 |
| JP | Hei 5-128323 | 5/1993 |
| JP | Hei 9-101735 | 4/1997 |
| JP | 11-345419 | * 12/1999 ............ G11B/7/00 |

OTHER PUBLICATIONS

Ming Li, et al., Demonstration of Computer–Generated Waveguide Hologram on InGaAsP–InP Waveguide for 1550–nm Optical Wavelength, IEEE Photonics Technology Letters, Vol 9, No. 7, pp. 958–960, Jul. 1997.

Amnon Yariv, "Propagation, Modulation, and Oscillation in Optical Dielectric Waveguide" Optical Electronics (4th edition), ISBNO–03–047444–2, Saunders College Publishing, pp. 479–487.

* cited by examiner

Primary Examiner—John D. Lee
Assistant Examiner—Sarah U Song
(74) Attorney, Agent, or Firm—Burns, Doane, Swecker & Mathis, LLP

(57) ABSTRACT

A laminated optical medium for read-only information recording has ultra-high memory capacity and reliably extracts desired information from laminated memories. Methods for low-cost mass production of laminated read-only medium are demonstrated. The optical medium is a lamination of planar type waveguides made of polymeric materials, in which each waveguide has information recorded as periodic scattering factor to generate scattered light by injection of input light into a waveguide layer. Therefore, read-only information recording medium of ultra-high memory capacity, equivalent to the memory capacity achievable by volume holography, can be produced by using a low-cost planar holographic technique. The laminated medium is simple and energy conserving, because it does not require rotation mechanisms for reproduction of music and video holographic recordings. The medium is ideally suited as identification card, because the card is difficult to counterfeit and a high level of extra information can be stored conveniently for use in a wide range of potential applications.

18 Claims, 1 Drawing Sheet

READ-ONLY LAMINATED INFORMATION RECORDING MEDIUM AND MANUFACTURING METHOD THEREFOR

BACKGROUND OF THE INVENTION

1. Field of the Invention

The present invention relates to manufacturing of read-only memory media, and relates, in particular, to a holographic memory card that is portable and has a much higher memory capacity than magnetic cards or IC cards. Such a card would be useful in many applications including e-commerce transactions for identification purposes, because the card is difficult to copy or counterfeit, and in reproduction of music and video recordings and computer softwares, because of its high memory capacity and low cost in mass production.

2. Description of the Related Art

Pocket-sized information cards that can be carried with a person, such as bank cards based on magnetic strip recording of individualized data, have been in wide general use. Also, in recent years, integrated circuit (IC) cards have been considered for use in e-commerce for identification purposes.

Magnetic cards are low in cost but they can easily be counterfeited, and IC cards, though difficult to counterfeit, suffer from the disadvantage of high cost of bits.

In the meantime, information storage medium based holographic technology is being evaluated, because of its high memory capacity and difficulty of counterfeiting. Holography can be considered in terms of features that can be gained by using a planar hologram versus volume hologram. Volume hologram is superior in memory capacity but is lacking in proper technology for information transfer and is not suitable for mass production. Therefore, it is difficult to be applied to read-only memory media such as identification cards and softwares for distribution.

As for the planar hologram, mass production based on printing technology is possible but the memory density is restricted, and considering the problems posed by current apparatus for image reproduction, it is less attractive than IC cards. To counter the problem of memory density, laminated holograms may be considered for increasing the memory capacity, but the existing methods of data reproduction suffers from the problem of cross talk, which causes interference of a desired hologram image by the images from holograms stored in other recording layers.

SUMMARY OF THE INVENTION

It is an object of the present invention to provide a read-only recording medium that provides a high memory capacity and is capable of selective reading of a recorded layer and is amenable to mass-production at low cost.

The object has been achieved in a laminated optical medium for read-only information recording comprised by a plurality of information recording layers structured by planar waveguides having periodic light scattering factor formed so as to generate scattered light by injecting an input light into a waveguide, wherein the planar waveguides are made of polymeric materials.

The present read-only information recording medium of ultra-high memory capacity enables to provide a level of memory capacity that is equivalent to the capacity achievable by volume holography, using a low-cost planar holographic technique. The laminated medium is simple and energy conserving, because it does not require rotation mechanisms for reproduction of music and video holographic recordings. The medium is ideally suited as identification card, because the card is difficult to counterfeit and a high level of extra information can be stored conveniently for use in a wide range of potential applications.

DESCRIPTION OF THE PREFERRED EMBODIMENT

Figure 1:
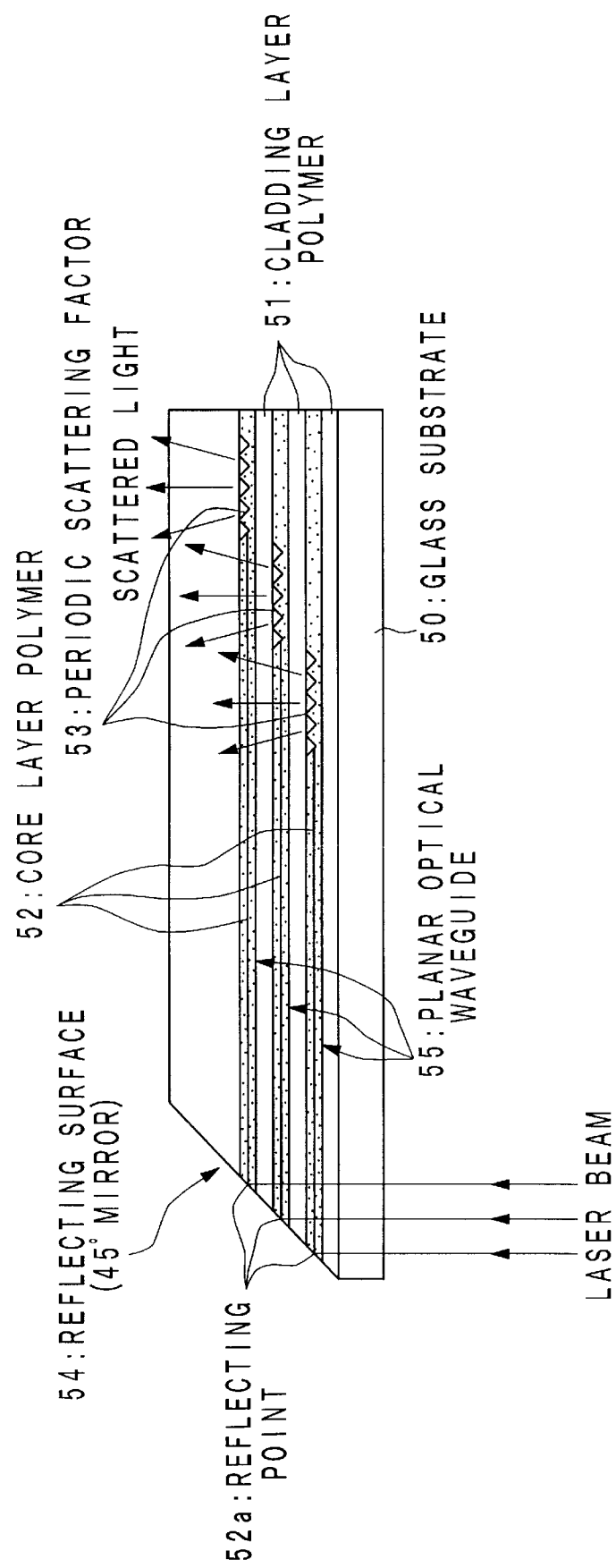
FIG. 1 is a schematic drawing to show a configuration of the laminated read-only hologram card and a method of light input/out from the card medium.

The following embodiments relate to a laminated read-only recording medium to enable selective reading of a desired hologram image, independent of holograms in other recording layers, and a method of making such a laminated read-only recording medium. Examples will be presented with reference to FIG. 1.

FIG. 1 shows a schematic cross sectional view of a read-only laminated hologram card. The hologram card is comprised by a periodic alternating structure, formed on a glass substrate 50, consisting of cladding/core/cladding/core/ . . . /cladding, and in any pair of cladding/core layers, the laser light of a given wavelength used for image generation will propagate in the single mode along the planar waveguide 55.

The waveguides 55 are laminated by superimposing one planar waveguide on top of another waveguide, and at least one side of the laminated medium is fabricated in such a way that the exposed surface forms a reflection surface (45-degree mirror) 54 slanted at 45 degrees to the normal to the lamination surface. Laser beam is focused by adjusting a converging lens so that the beam is focused on the slanted section of a core layer 52.

When the reflection surface 54 is bare, total reflection occurs and there is no need to provide any special reflection layer on the slanted surface, but when the surface is protected with a coating such as resin coating, it is necessary that the slanted section be provided with a reflection surface made of a dielectric film or a metal film.

The numerical aperture $NA_L$ is defined in equation 1 where 2D is a lens diameter and f is a focus distance while the $NA_{WG}$ for the waveguide is defined in equation 2 where $n_a$ is a refractive index of the core layer, and n, is a refractive index of the cladding layer.

$$NA_L = D/\sqrt{(f^2)^2} \qquad (1)$$

$$NA_{WG} = \sqrt{(na^2 + n_c^2)} \qquad (2)$$

Light reflected from the reflection point 52a into the waveguide behaves as guided waves which propagate periodically from the reflection point as the origin mostly within the planar core layer 52 and spread out as they propagate in the waveguide. The angle of spread is given by $2\sin^{-1}(NA_L)$ and can be altered by changing the converging lens. Part of the guided waves are scattered by periodic scattering factor 53 recorded on the core layer 52 or the cladding layer 51, and are leaked out of the waveguide path, but when the periodic scattering factor 53 are distributed in periodic patterns, scattered light in certain directions will be in-phase (i.e., refracted beams) to form a spatial hologram image.

FIG. 1 shows a case of periodic scattering factor 53 represented by a series of bumps and dents formed on the core layers 52.

Here, the periodic scattering factor refer, in practice, to periodic roughening or periodic variations in refractive index formed at the core/cladding interfaces of the waveguides, but the important consideration is that the scattering is caused by some periodic structures to cause the guided waves to be refracted out of the waveguide plane.

The periodic scattering factor in the present invention are provided in three types as indicated in the following.

(1) Periodic scattering factor are formed as a periodic structure of bumps and dents in the core or cladding layer in the planar waveguide.

(2) Periodic scattering factor are formed by periodic altering of the refractive index of the core or cladding layer in the planar waveguide.

(3) Periodic scattering factor are formed by a material different than the material of the core or cladding layer.

In practice, a structure of periodic scattering factor is produced by one of the four following methods.

(a) A method for making periodic structures of physical surface irregularities (such as bumps and dents) is to first form a cladding layer or a core layer; then a resist coating is applied; and patterns are scribed on the resist coating by exposing the resins surface to an electron light beam, next the cladding layer or the core layer is dry etched using the patterned resist coating as masking; then the resist coating is removed and another core or cladding layer is formed on top.

(b) Another method for making periodic physical structures is to press (stamp) a cladding layer or a core layer with a metal template having a periodic structure of bumps and dents so as to imprint the periodic patterns, followed by layering another core layer or a cladding layer on top.

(c) Another method for making scattering centers is to alter the refraction index of a core layer or a cladding layer by irradiating the layer with an electron beam in such a way to form periodic structures.

(d) Another method for making periodic physical structures is to apply a resist coating on a cladding layer or a core layer, and then to scribe patterns on the resist coating by irradiating with an electron beam.

Also, the feature of the present laminated read-only holographic card is that polymeric materials are used for the card medium so that the card may be mass produced at low cost and used widely for general purposes. Potential card materials should have high transparency to input light and be able to be formed into planar waveguides.

The following lists such polymeric materials for potential use in making the card medium.

Thermoplastic resins including polyacrylate resins headed by polymethyl methacrylate (PMMA), polycarbonate resins, polyether resins, polyimide resins, polyamide resins, polyolefin resins, silicone resins, epoxy resins, as well as thermosetting resins starting with epoxy resins, and UV curable resin including acrylic resins, epoxy resins.

Potential materials for resist coating are listed below.

Electron beam reacting resins include the following substances.

Negative forming type: polymers halide including chloromethyl polystyrene, polymers epoxide including epoxide polybutadiene; glycidyl methacrylate; inorganic negative forming resist (SNR) including chloromethyl polysiloxane; and chemically sensitized resist typically represented by t-butoxy carbonyl protected polyhydrostyrene containing acid generating agent.

Positive forming type: polymethacrylate resins including polymethyl methacrylate, polyfluoro methacrylate (PFM); polysulfone resins including polybutylenesulfone; and polyketone resins including polymethyl isopropylketone.

Photo-resist type material are represented by the following substances.

Negative forming type: inorganic photo-resists including single-chain rubbers with azide compounds, azide compounds with alkaline soluble polymer, azide comnpounds with polysiloxane; chemically sensitized resist typically represented by epoxy resin containing acid forming agent; and negative forming dry film resist.

Positive forming type: AZ type resist including diazonaphtoquinone diazonaphtoquinone- novolac resin, positive type photo-resist including diazonaphtoquinone-polysiloxane; and positive forming dry film resist.

Therefore, the present read-only hologram cards in the form of laminated planar holograms can be mass produced at low cost, using the present method, as ultra-high capacity information storage medium comparable in capacity to volume holograms. Furthermore, unlike regular optical memory discs, rotation mechanisms are not required so that an advantage is energy conservation for reproducing music and video recordings. When the card medium is to be used for identification purposes, hologram cards are very useful not only because of the difficulty of counterfeiting but because various additional information can be stored in the vast memory capacity of a hologram image.

Some practical examples will be presented in the following.

EXAMPLE 1

Samples of a lamination structure shown in FIG. 1, represented by UV curable resin/PMMA/UV curable resin/PMMA/UV curable resin . . . /PMMA/UV curable resin, were prepared on an optically polished glass substrate 50 of three inches in length.

The polymer for cladding layer 51 was a UV curable resin, and the polymer for core layer 52 was PMMA. The refractive index of the resin was 1.475 and the layer thickness 8 $\mu$m, and the refractive index of PMMA was 1.485 and the layer thickness was 2.4 $\mu$m The method of making the holographic card is described below. First, an epoxy oligomer was spin coated on a glass substrate 50 to a thickness of about 8 $\mu$m. Next, the entire surface was exposed to UV-radiation, bake dried and cured. A coating of a negative forming electron beam scribing resist of inorganic type was applied on the cured layer. The coating was patterned by exposing to periodic electron beam, and photo-processed to produce periodic scattering patterns having a line width of 0.1 $\mu$m. Reactive oxygen ion etching was performed using the patterned resist as masking to etch the lower layer of epoxy resin to a depth of 0.1 $\mu$m to generate the periodic scattering factor 53 on the cladding layer 51.

Next, the resist layer was peeled off, and a core layer 52 of PMMA was spin coated on the cladding layer 51 to a thickness of about 2.4 $\mu$m. The core layer 52 was bake dried, and the UV-sensitive epoxy oligomer was spin coated to a thickness of 8 $\mu$m on the core layer 52. Next, the entire surface was subjected to UV-radiation and bake dried and cured.

The process of coating a lower cladding layer and coating an upper core layer was repeated ten times to produce a desired waveguide lamination. An edge section of the lamination was then fabricated to produce a slanted surface inclined at 45 degrees, to serve as the 45-degree mirror 54, using a 90-degree cutter.

Next, a solid-state laser having an output wavelength at 683 nm was used to generate a parallel beam of 5 $\mu$m in diameter through a collimating lens, and focused on the reflection mirror 54 through a converging lens of a focal distance 14 μm, resulting in generating diffracted light in opposite vertical directions.

EXAMPLE 2

Instead of PMMA for the core layer in Example 1, a UV curable epoxy resin was used. The refractive index of the cladding layer 51 was 1.475 and the layer thickness was 8 μm, and the refractive index of the core layer was 1.485 and the layer thickness was 2.4 μm.

This method of making the hologram card was as follows. First, UV curable epoxy oligomer was spin coated to a thickness of about 8 μm. Next, the entire surface was subjected to UV radiation, and bake dried and cured. A negative type electron beam etching inorganic resist was spin coated on the hard surface. The coating was patterned by exposing to a periodic electron beam, and photo-processed to produce periodic scattering patterns having a line width of 0.1 μm.

Reactive oxygen ion etching was performed using the patterned resist as masking to etch the lower layer of epoxy resin to a depth of 0.1 μm to generate the periodic scattering factor 53 on the cladding layer 51. Next, the resist layer was peeled off, and a UV-sensitive epoxy oligomer, as a core layer, was spin coated on the cladding layer 51 to a thickness of about 2.4 μm.

Next, the entire surface was subjected to UV radiation and bake dried and cured. After bake drying the core layer 51, a UV-sensitive epoxy oligomer was spin coated on the core layer to a thickness of about 8 μm. Next, the entire surface was subjected to UV radiation and bake dried and cured.

The process of coating a lower cladding layer and coating an upper core layer was repeated ten times to produce a waveguide lamination. An edge section of the lamination was then fabricated to produce a slanted surface inclined at 45 degrees, to serve as the 45-degree mirror 54, using a 90-degree cutter.

Next, a solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 3

As in Example 1, samples of a lamination structure shown in FIG. 1, represented by represented by TV curable resin/ PMMA/UV curable resin/PMMA/ UV curable resin . . . /PMA/UV curable resin, were prepared on an optically polished glass substrate 50 of three inches in length.

The polymer for the cladding layer 51 was a UV curable resin, and the polymer for the core layer 52 was PMMA. The refractive index of the UV curable resin was 1.475 and the layer thickness was 8 μm, and the refractive index of PMMA layer was 1.485 and the layer thickness was 2.4 μm.

The method of making this hologram card was, first, a UV-sensitive epoxy oligomer was spin coated on a glass substrate 50 to a thickness of 8 μm. Next, the entire surface was subjected to UV radiation, and bake dried and cured. Next, PMMA as a core layer 52 was spin coated on the cladding layer 51 to a thickness of 2.4 μm. After bake drying the core layer 52, an electron beam sensitive photo-resist of the inorganic negative type was spin coated on the core layer 52. Patterns containing the periodic scattering factor were produced by exposure to periodic electron beam and photo-processing to produce scattering patterns having a line width of 0.1 μm.

Using the patterns having the periodic scattering factor produced on the resist layer as masking, reactive oxygen ion etching was performed to etch the lower PMMA layer to a depth of 0.1 μm to produce the periodic scattering factor 53 on the core layer 52. After peeling the resist layer, a UV-sensitive epoxy oligomer was spin coated on the core layer 52 to a thickness of about 8 μm. Next, the entire surface was subjected to UV radiation and bake dried and cured.

The process of coating a lower cladding layer and an upper core layer was repeated ten times to produce a waveguide lamination. An edge section of the lamination was then fabricated to produce a slanted surface inclined at 45 degrees, to serve as the 45-degree mirror 54, using a 90-degree cutter.

Next, a solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 4

As shown in FIG. 1, the polymeric laminated structure was produced on an optically polished glass substrate 50 of three inches in length. Cladding layer polymer and core layer polymer were a UV curable resin. The refractive index of the cladding layer was 1.475 and the layer thickness was 8 μm, and the refractive index of the core layer was 1.485 and the layer thickness was 2.4 μm.

The method of making this hologram card was, first, a UV-sensitive epoxy oligomer was spin coated on a glass substrate 50 to a thickness of 8 μm. Next, the entire surface was subjected to UV radiation, and bake dried and cured. Next, a UV-sensitive epoxy oligomer as a core layer 52 was spin coated on the cladding layer 51 to a thickness of 2.4 μm. Next, the entire surface was subjected to UV radiation, and bake dried and cured. An electron beam sensitive photo-resist of the inorganic negative type was spin coated on the core layer 52. Patterns containing the periodic scattering factor were produced by exposure to periodic electron beam and photo-processing to produce scattering patterns having a line width of 0.1 μm.

Using the patterns having the periodic scattering factor produced on the resist layer as masking, reactive oxygen ion etching was performed to etch the epoxy core layer 52 to a depth of 0.1 μm to produce the periodic scattering factor 53. After peeling the resist layer and the core layer 52 was bake dried, a UV-sensitive epoxy oligomer was spin coated on the core layer 52 to a thickness of about 8 μm. Next, the entire surface was subjected to UV radiation and bake dried to produce a cured lamination structure.

The process of coating a lower cladding layer and an upper core layer was repeated ten times to produce a desired waveguide lamination. An edge section of the lamination was then fabricated to produce a slanted surface inclined at 45 degrees, to serve as the 45-degree mirror 54, using a 90-degree cutter.

Next, a solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 5

As in Example 1, samples of a lamination structure shown in FIG. 1, represented by represented by UV curable resin/PMMA/UV curable resin/PMMA/UV curable resin . . . /PMMA/UV curable resin, were prepared on an optically polished glass substrate 50 of three inches in length.

The cladding layer polymer was a UV curable resin, and the core layer polymer was PMMA. The refractive index of the UV curable resin was 1.475 and the layer thickness was 8 μm, and the refractive index of PMMA was 1.485 and the layer thickness was 2.4 μm.

The method of making the hologram card was, first, to spin coat a UV curable resin on a glass substrate 50 to a thickness of 8 μm, followed by hardening with UV radiation. Next, PMM as a core layer was spin coated to a thickness of 2.4 μm. Next, the coating was heated to 110° C. and a metal template, having the periodic scattering factor 53 comprised by bumps and dents, was pressed against the softened core layer (stamping method) to imprint the patterns. The process of UV curable resin coating/UV exposure/PMMA coating/pattern imprinting was repeated ten times, and finished with spin coating of a UV curable resin and exposing to UV radiation to produce a desired laminated hologram card. An edge section of the lamination was then cut and polished to produce a slanted surface inclined at 45 degrees, to serve as the 45-degree mirror 54.

A solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions. It was confirmed that the same results were obtained when the reflection mirror was produced by cutting with a dicing saw.

EXAMPLE 6

Instead of PMMA for the core layer in Example 1, a thermosetting epoxy resin was used. The refractive index of the UV curable resin was 1.475 and the layer thickness was 8 μm, and the refractive index of the thermosetting resin was 1.485 and the layer thickness was 2.4 μm, The method of making the hologram card was the same as that in Example 5. The thermosetting epoxy resin was spin coated and heated at 110° C. to stamp the periodic patterns using a metal template to produce the periodic scattering factor 53. The process of UV curable resin coating/UV exposure/PMMA coating/pattern imprinting was repeated ten times, and finished with spin coating of a UV curable resin and exposing to UV radiation to produce a desired laminated hologram card. An edge section of the lamination was then cut and polished to produce a slanted surface inclined at 45 degrees, to serve as the 45-degree mirror 54.

A solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 7

Instead of PMMA for the core layer in Example 5, a UV curable epoxy resin was used. The refractive index of the polymer used for the cladding layer 51 was 1.475 and the layer thickness was 8 μm, and the refractive index of thermosetting epoxy resin used for the core layer was 1.485 and the layer thickness was 2.4 μm The method of making the hologram card was the same as that of Example 6, so that first, a UV curable resin was spin coated on a glass substrate 50 to a thickness of 8 μm, and irradiated with UV radiation to convert to a gel state. Next, a metal template having periodic patterns was pressed on the core layer to imprint the patterns while heating the layer to 110° C. and harden the layer. This operation imprinted the patterns on the metal template on the core layer to produce scattering factor 53. Next, the process of UV curable resin coating for cladding layer/UV curable of cladding layer/UV curable resin coating for core layer/UV radiation for core layer gel formation/stamping with metal template/thermal hardening was repeated ten times, and finished with spin coating of a UV curable resin and exposing to UV radiation to produce a desired laminated hologram card. An edge section of the lamination was then cut and polished to produce a slanted surface inclined at 45 degrees, to serve as the 45-degree mirror 54.

A solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 8

As in Example 1, samples of a lamination structure shown in FIG. 1, represented by UV curable resin/PMMA/UV curable resin/PMMA/UV curable resin . . . /PMMA/UV curable resin, were prepared on an optically polished glass substrate 50 of three inches in length.

The cladding layer polymer was a UV curable resin, and the core layer polymer was PMMA. The refractive index of the UV curable resin was 1.475 and the layer thickness was 8 μm, and the refractive index of PMMA was 1.485 and the layer thickness was 2.4 μm.

The method of making the hologram card was to spin cast first a UV curable epoxy resin to a thickness of 8 μm, which was followed by hardening with UV radiation Next, PMMA as a core layer was spin coated to a thickness of 2.4 μm, and an electron beam was used to partially alter the refractive index of exposed regions slightly to produce scattering factor. This process of UV curable resin coating/UV exposure/PMMA coating/e-beam exposure was repeated ten times, and finished with spin coating with a UV curable resin and UV exposure to produce a desired hologram card. The end of the laminated card was cut with a dicing saw and polished at an angle of 45 degrees to produce the reflection mirror 45.

A solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 9-1

Laminated hologram card in Example 9-1 had both core and cladding layers were a fluoride group UV curable resin, and the periodic scattering factor 53 were produced by e-beam exposure to alter the refractive index of the core layer. In this case, scattering factor were generated by severing of the fluorine bonds in the resin by e-beam radiation, resulting in slight lowering of the refractive index of the regions exposed to the e-beam.

The cladding layer had a refractive index of 1.475 and the layer thickness was 8 μm while the core layer had a refractive index of 1.485 and the layer thickness was 2.4 μm. The process of UV curable cladding resin coating/UV exposure/UV curable core coating/e-beam exposure was repeated ten times, and finished with spin coating of a UV curable resin and exposing to UV radiation to produce a desired laminated hologram card. An end of the lamination was cut at 45 degrees with a dicing saw to produce a 45-degree mirror 54.

A solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 9-2

Instead of the fluoride group UV curable resin used in Example 9-1, a fluoride group polyimide resin (refractive index 1.485) was used for the core layer and another fluoride group polyimide resin having a slightly lower refractive index (refractive index 1.475) was used for the cladding layer. The same procedure was followed to produce a laminated hologram card, which produced two images as in Example 9-1.

EXAMPLE 10-1

As in Example 1, samples of a lamination structure shown in FIG. 1, represented by UV curable resin/PMMA/UV curable resin/PMMA/UV curable resin . . . /PMMA/UV curable resin, were prepared on an optically polished glass substrate 50 of three inches in length.

The cladding layer was a UV curable resin, and the core layer was PMMA. The refractive index of the UV curable resin was 1.475 and the layer thickness was 8 μm, and the refractive index of PMMA was 1.485 and the layer thickness was 2.4 μm.

The method of making this hologram card was, first, a UV-sensitive epoxy oligomer was spin coated on a glass substrate 50 to a thickness of 8 μm. Next, the entire surface was subjected to UV radiation, and bake dried and cured. Next, a UV-sensitive epoxy oligomer as a core layer 52 was spin coated on the cladding layer 51 to a thickness of 2.4 μm. After bake drying the core layer 52, a negative type resist layer was spin coated on the core layer 52 to a thickness of 0.1 μm. A laser beam was radiated periodically on the core layer 52 and the exposed resist was photo-processed to produce the periodic scattering factor 53 having a 0.1 μm line width. After bake drying the core layer 52, a UV-sensitive epoxy oligomer was applied on the core layer 52 to a thickness of 8 μm.

Next, the entire surface was irradiated with UV radiation, and bake dried and cured. The process of coating a lower cladding layer and an upper core layer was repeated ten times to produce a desired waveguide lamination. An edge section of the lamination was then fabricated to produce a slanted surface inclined at 45 degrees, to serve as the 45-degree mirror 54, using a 90-degree cutter.

A solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 10-2

As shown in FIG. 1, the polymeric laminated structure was produced on an optically polished glass substrate 50 of three inches in length. Cladding layer polymer and core layer polymer were a UV curable resin. The refractive index of the cladding layer was 1.475 and the layer thickness was 8 μm, and the refractive index of the core layer was 1.485 and the layer thickness was 2.4 μm.

The method of making this hologram card was, first, a UV-sensitive epoxy oligomer was spin coated on a glass substrate 50 to a thickness of 8 μm. Next, the entire surface was subjected to UV radiation, and bake dried and cured. Next, a UV-sensitive epoxy oligomer as a core layer 52 was spin coated on the cladding layer 51 to a thickness of 2.4 μm. Next, the entire surface was subjected to UV radiation, and bake dried and cured. An electron beam sensitive photoresist of the inorganic negative type was spin coated on the core layer 52. Patterns containing the periodic scattering factor were produced by periodic exposure to a laser beam and photo-processing to produce scattering patterns having a line width of 0.1 μm.

Using the patterns having the periodic scattering factor produced on the resist layer as masking, reactive oxygen ion etching was performed to etch the epoxy core layer 52 to a depth of 0.1 μm to produce the periodic scattering factor 53. After peeling the resist layer and the core layer 52 was bake dried, a UV-sensitive epoxy oligomer was spin coated on the core layer 52 to a thickness of about 8 μm. Next, the entire surface was subjected to UV radiation and bake dried and cured.

The process of coating a lower cladding layer and an upper core layer was repeated ten times to produce a desired waveguide lamination. An edge section of the lamination was then fabricated to produce a slanted surface inclined at 45 degrees, to serve as the 45-degree mirror 54, using a 90-degree cutter.

Next, a solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 11

As in Example 1, samples of a lamination structure shown in FIG. 1, represented by UV curable resin/PMMA/UV curable resin/PMMA/UV curable resin . . . /PMMA/UV curable resin, were prepared on an optically polished glass substrate 50 of three inches in length. The cladding layer polymer was a UV curable resin, and the core layer polymer was PMMA.

The method of making this hologram card was, first, a UV-sensitive epoxy oligomer was spin coated on a glass substrate 50 to a thickness of 8 μm. Next, the entire surface was subjected to UV radiation, and bake dried and cured. Next, PMMA as a core layer 52 was spin coated on the cladding layer 51 to a thickness of 2.4 μm. After bake drying the core layer 52, and patterns containing the periodic scattering factor were produced by a periodic exposure to the electron beam and photo-processing to produce scattering patterns having a line width of 0.1 μm. After bake drying the core layer 52, a UV-sensitive epoxy oligomer was spin coated on the core layer 52 to a thickness of about 8 μm.

Next, the entire surface was subjected to UV radiation and bake dried to produce a cured core layer The process of coating a lower cladding layer and an upper core layer coating was repeated ten times to produce a desired waveguide lamination. An edge section of the lamination was then fabricated to produce a slanted surface inclined at 45 degrees, to serve as the 45-degree mirror 54, using a 90-degree cutter.

Next, a solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 12

As in Example 1, samples of a lamination structure shown in FIG. 1, represented by UV curable resin/PMMA/UV curable resin/PMMA/ . . . UV curable resin/PMMA/UV curable were prepared on an optically polished glass substrate 50 of three inches in length.

The cladding layer was a UV curable resin, and the core layer was PMMA. The refractive index of the UV curable resin was 1.475 and the layer thickness was 8 μm, and the refractive index of PMMA was 1.485 and the layer thickness was 2.4 μm.

The method of making this hologram card was, first, a UV-sensitive epoxy oligomer was spin coated on a glass substrate 50 to a thickness of 8 μm. Next, the entire surface was subjected to UV radiation, and bake dried and cured. Next, PMMA as a core layer 52 was spin coated on the cladding layer 51 to a thickness of 2.4 μm. After bake drying the core layer 52, an electron beam sensitive photo-resist coating of negative forming type was spin coated on the core layer 52 to a thickness of 0.1 μm. Patterns containing the periodic scattering factor were produced by a periodic exposure to an electron beam and photo-processing to produce scattering patterns having a line width of 0.1 μm. After bake drying the core layer 52, a UV-sensitive epoxy oligomer was spin coated on the core layer 52 to a thickness of about 8 μm.

Next, the entire surface was subjected to UV radiation and bake dried to produce a cured core layer. The process of coating a lower cladding layer and an upper core layer coating was repeated ten times to produce a desired waveguide lamination. An edge section of the lamination was then fabricated to produce a slanted surface inclined at 45 degrees, to serve as the 45-degree mirror 54, using a 90-degree cutter.

Next, a solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 13~20

In Example 13~20, the polymeric materials used in Example 12 for forming the core layer and the cladding layer in the laminated waveguide type hologram card were varied by replacing with polycarbonate, polyamide, polyether, polysiloxane, polyimide and polyolefin, as shown in Table 1.

TABLE 1

| | WAVEGUIDE STRUCTURE | |
|---|---|---|
| EXAMPLES | CORE (REFRACTIVE INDEX) | CLADDING (REFRACTIVE INDEX) |
| 13 | POLYCARBONATE (1.485) | EPOXY RESIN (1.475) |
| 14 | POLYAMIDE (1.485) | EPOXY RESIN (1.475) |
| 15 | POLYETHER (1.485) | EPOXY RESIN (1.475) |
| 16 | POLYPHENYL-SILSEQUIOXANE (1.485) | EPOXY RESIN (1.475) |
| 17 | POLYPHENYL-SILSESQUIOXANE (1.485) | POLYMETHYL-PHENYLSILSES-QUIOXANE (1.475) |
| 18 | POLYIMIDE (1.545) | POLYIMIDE (1.535) |
| 19 | POLYOLEFIN (1.510) | EPOXY RESIN (1.500) |
| 20 | POLYOLEFIN (1.510) | ACRYLIC RESIN (1.500) |

The end of the lamination was cut with a cutter to produce a 45-degree mirror.

Next, a solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 21~23

In Example 21-23, a press-rolled thin film of a polymeric material was used to make the core layer or the cladding layer. Each of these Embodiments will be presented separately below.

EXAMPLE 21

Scattering factor were produced by the stamping method. A sheet of film of PMMA having a refractive index of 1.485 was heated to 110° C. and a metal template having scattering patterns was pressed against the film. Next, the embossed film was placed between two film strips of epoxy resin having a refractive index of 1.475, and the laminated sheets were press-rolled. This process was repeated ten times in the sheet form using an assembly line to produce a lamination structure, shown in FIG. 1, comprised by epoxy resin/PMMA/epoxy resin/PMMA/epoxy resin . . . /PMMA/epoxy resin. The laminated sheet was cut into a card size, and the end of the laminated card was cut and polished at an angle of 45 degrees.

Next, a solid-state laser having an output wavelength at 683 nm was used to generate a parallel beam of 5 μm in diameter through a collimating lens, and focused on the reflection mirror 54 through a converging lens of a focal distance 14 μm, resulting in generating diffracted light in opposite vertical directions.

EXAMPLE 22

A UV curable epoxy resin having a refraction index of 1.485 was casting to a thickness of 2.4 μm on top a press-rolled epoxy resin sheet material of 8 μm thickness, having a refractive index of 1.475. The core layer was UV-radiated to convert to a gel state. A metal template having scattering patterns is pressed against the sheet material while heating at 110° C. to harden the lamination. This process embosses the scattering patterns on the core sheet to produce the periodic scattering factor. Next, the embossed sheet is placed between two epoxy resin films having a refractive index of 1.475, and the lamination is press-rolled to produce a desired waveguide structure shown in FIG. 1.

This process, (comprised by cladding layering/UV curable of epoxy resin coating/UV-gelling of core layer/pattern stamping and layer curing/press rolling of lamination) was repeated ten times in the sheet form using an assembly line to produce a lamination structure. The laminated sheet was cut into a card size, and the end of the laminated card was cut and polished at an angle of 45 degrees. The end of the lamination was cut at 45 degrees with a dicing saw to produce the reflection mirror 45.

Next, a solid-state laser having an output wavelength at 683 nm was used to generate a parallel beam of 5 µm in diameter through a collimating lens, and focused on the reflection mirror 54 through a converging lens of a focal distance 14 µm, resulting in generating diffracted light in opposite vertical directions.

EXAMPLE 23

Scattering factor were produced by e-beam etching or laser scribing on a dry process photo-resist film. Concurrent to peeling the cover film, a dry process resist film was thermally laminated on the core layer of PMMA film having a refractive index of 1.485. Patterns were scribed through masking or directly, followed by photo-processing.

Next, the embossed sheet is placed between two epoxy resin films having a refractive index of 1.475, and the lamination is press-rolled. This process was repeated ten times in the sheet form using an assembly line to produce a lamination structure, shown in FIG. 1, comprised by epoxy resin/ PMMA/epoxy resin/PMMA/epoxy resin . . . /PMMA/ epoxy resin. The laminated sheet was cut into a card size, and the end of the laminated card was cut and polished at an angle of 45 degrees.

Next, a solid-state laser having an output wavelength at 683 nm was used to generate a parallel beam of 5 µm in diameter through a collimating lens, and focused on the reflection mirror 54 through a converging lens of a focal distance 14 µm, resulting in generating diffracted light in opposite vertical directions.

What is claimed is:

1. A read-only multilayer holographic memory card comprising:
    a plurality of laminated structures, each laminated structure comprising:
        a cladding layer having a refractive index of a first predetermined value; and
        a core layer having a refractive index of a second predetermined value exceeding said first predetermined value,
        wherein the cladding layer and/or the core layer have physical irregularities formed thereon for thereby providing a periodic scattering effect which is achieved without performing holographic recording, and wherein said cladding layer and said core layer comprise polymeric materials selected from the group consisting essentially of polyacrylic resins, polycarbonate resins, polyimide resins, polyamide resins, polyether resins, polyolefin resins, silicone resins, ultra-violet radiation curable resins and thermosetting resins.

2. The memory card of claim 1, further comprising a slanted reflection surface provided at one end of said plurality of laminated structures, such that input light injected transversely to said plurality of laminated structures enters the laminated structures by being totally internally reflected by said slanted reflection surface, or by being reflected by a metal film or dielectric film formed on said slanted reflection surface, said slanted reflection surface being fabricated at an angle to a line normal to the laminated structures so as to reflect the input light into the laminated structures.

3. The memory card of claim 1, wherein said irregularities comprise periodic patterns of bumps and dents formed on each core layer and/or cladding layer.

4. The memory card of claim 1, wherein said irregularities comprise periodic patterns of altered refractive index in a core layer and/or a cladding layer.

5. The memory card of claim 1, wherein said irregularities comprise differences in the material comprising a core layer and/or a cladding layer.

6. The memory card of claim 1, wherein said irregularities are produced after forming a cladding layer or a core layer made of polymeric materials.

7. The memory card of claim 6, wherein a core layer or a cladding layer made of polymeric materials is produced by spin coating, casting or press-rolling.

8. The memory card of claim 3, wherein the irregularities are produced by first producing a core layer or a cladding layer and selectively removing parts of said core layer or said cladding layer.

9. The memory card of claim 8, wherein a lamination of recording layers is produced by first process of producing a core layer or a cladding layer, followed by a second process of selectively removing parts of said cladding layer or said core layer, and repeating said first process and said second process until a desired number of laminations is produced.

10. The memory card of claim 8, wherein the irregularities are produced by first applying a photo-resist coating on a cladding layer or a core layer, producing periodic patterns by scribing with an electron beam or light beam, and dry etching said cladding layer of said core layer using said photo-resist coating as masking.

11. The memory card of claim 3, wherein the irregularities are produced by pressing a metal template having periodic patterns on said cladding layer or said core layer so as to imprint said periodic patterns to said cladding layer or said core layer.

12. The memory card of claim 11, wherein an additional cladding layer or an additional core layer is laminated after imprinting said periodic patterns on said cladding layer or said core layer.

13. The memory card of claim 4, wherein said irregularities are introduced in a cladding layer or a core layer by electron beam scribing or light scribing.

14. The memory card of claim 5, wherein said irregularities are produced by applying a photo-resist coating on a cladding layer or a core layer, and scribing patterns by means of electron beam scribing or light scribing.

15. The memory card of claim 1, wherein the core layer comprises a PMMA (polymethyl methacrylate) material.

16. The memory card of claim 1, wherein said second predetermined value exceeds said first predetermined value by about 0.010.

17. A read-only multilayer holographic memory card comprising:
    a glass substrate; and
    a plurality of laminated structures, each of which contains a cladding layer and a core layer,
        wherein the cladding layer comprises a UV-curable resin having a refractive index of about 1.475 in a thickness of about 8 µm, the core layer comprises a PMMA (polymethyl methacrylate) material having a refractive index of about 1.485 in a thickness of about 2.4 μm, and wherein the cladding layer and/or the core layer have physical irregularities formed thereon for thereby providing a periodic scattering effect which is achieved without performing holographic recording.

18. A read-only multilayer holographic memory card comprising:

a glass substrate; and a plurality of laminated structures, each of which contains a cladding layer and a core layer, wherein the cladding layer comprises a UV-curable resin having a refractive index of a first predetermined value, the core layer comprises a PMMA (polymethyl methacrylate) material having a refractive index of a second predetermined value exceeding said first predetermined value by about 0.010, and wherein the cladding layer and/or the core layer have physical irregularities formed thereon for thereby providing a periodic scattering effect which is achieved without performing holographic recording.

* * * * *